(12) United States Patent
Jones

(10) Patent No.: US 6,295,207 B1
(45) Date of Patent: *Sep. 25, 2001

(54) RETRACTABLE AND REMOVABLE EXTENSIONS WITH EDGE PLATED PCB'S IN THIN-PROFILE ELECTRONIC DEVICES

(75) Inventor: Jeffrey L. Jones, Orem, UT (US)

(73) Assignee: 3Com Corporation, Santa Clara, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/416,542

(22) Filed: Oct. 12, 1999

(51) Int. Cl.[7] ................................ H05K 1/14
(52) U.S. Cl. .................. 361/737; 361/736; 361/752; 361/753; 439/74; 439/131
(58) Field of Search ................ 361/752, 584, 361/685, 686, 736, 737; 439/131, 676, 74

(56) References Cited

U.S. PATENT DOCUMENTS

| | | | |
|---|---|---|---|
| 4,551,746 | * 11/1985 | Gilbert et al. | 357/74 |
| 4,560,962 | * 12/1985 | Barrow | 333/1 |
| 4,821,007 | * 4/1989 | Fields et al. | 333/238 |
| 5,411,405 | * 5/1995 | McDaniels et al. | 439/131 |
| 5,412,253 | * 5/1995 | Hough | 307/17 |
| 5,547,401 | * 8/1996 | Aldous et al. | 439/676 |
| 5,552,567 | * 9/1996 | Peterson et al. | 174/261 |
| 5,634,802 | * 6/1997 | Kerklaan | 439/131 |
| 5,876,218 | * 3/1999 | Liebenow et al. | 439/74 |
| 5,918,163 | * 6/1999 | Rossi | 455/90 |
| 5,971,777 | * 10/1999 | Garside | 439/131 |

* cited by examiner

Primary Examiner—Jeffrey Gaffin
Assistant Examiner—Tuan Dinh
(74) Attorney, Agent, or Firm—Kirton & McConkie; Michael F. Krieger

(57) ABSTRACT

The present invention relates to a removable and/or retractable extension for an electronic apparatus which is electrically connected to the apparatus through electrically conductive surfaces which are formed on the edge of a PCB. Some preferred embodiments of the present invention comprise PCB edge conductors which are formed by preparation of the edge surface followed by typical plating methods while other preferred embodiments comprise PCB edge conductors formed by exposing surfaces of conductors formed by filling vias with conductive material. The extensions of some embodiments of the present invention comprise antennas, physical/electrical media connectors and similar electrical and electronic devices.

22 Claims, 5 Drawing Sheets

RETRACTABLE AND REMOVABLE EXTENSIONS WITH EDGE PLATED PCB'S IN THIN-PROFILE ELECTRONIC DEVICES

THE FIELD OF THE INVENTION

The present invention relates to retractable and removable extensions in electronic devices which have limited space above and below the printed circuit board. The movable extensions of the present invention comprise a printed circuit board with edge plating which extends the circuitry of the board to the edge of the board where electrical connections can be made without increasing the thickness of the device. These movable extensions of the present invention may comprise antennas, physical/electrical media connectors such as plugs and jacks or other components with electrical or electronic circuits.

BACKGROUND

Electronics connectors in the computer and communications industry are available for a wide array of applications from communications and data transfer applications to power connections. Due to the pace of technology in this area and the trend toward smaller, more efficient and more capable hardware, connectors evolve on an almost daily basis. A plethora of standards have evolved for specific connector and hardware applications, however proprietary connectors also proliferate throughout the industry.

Some standards in the electrical connector industry have been created by government regulation such as the Federal Communications Commission's Title 47, § 68.500, otherwise denoted "Subpart F—Connectors" (Subpart F). Subpart F is incorporated herein by reference. Subpart F contains detailed specifications for "miniature" connectors used in the communications industry. Included in this specification are the "Miniature 6-position plug and jack" and the "Miniature 8-position plug and jack." These connectors, commonly known as the RJ-11 connector and the RJ-45 connectors, respectively, are ubiquitous throughout the industry.

The miniature 6-position connector or RJ-11 has emerged as the industry standard connector for telephone lines. RJ-11 plugs and jacks are used on almost all telephone sets for connection to the phone system and consequently are used for standard modem connections which also use these telephone lines. Although most telephone companies use only 4 or 2 of the available positions on the connector, the 6-position connector is the standard.

The miniature 8-position connector or RJ-45 has become an industry standard connector for computer networks. It is used for inter-connectivity between network adapter cards, hubs, routers, switches and other network hardware.

These connectors have been the industry standard for many years and are likely to remain so in the future for telephones, desktop computer modems and network adapters, and other substantially stationary communications equipment. However, hardware technology and the "miniaturization" of components has progressed to the point that the standard, "miniature" RJ connectors have a larger cross-section than the thickness of the hardware to which they connect.

An example of these smaller, thin profile hardware configurations is the PC Card Standard promulgated by the Personal Computer Memory Card International Association (PCMCIA). The PCMCIA PC Card standard identifies three primary card type designations: Type I, II and III. These type designations correspond to physical dimension restrictions or "form factors" of 85.6 mm (length)×54.0 mm (width) and thicknesses of 3.3 mm, 5.0 mm and 10.5 mm respectively. These thin profile expansion cards are used to expand the functionality of computers and related products by adding circuitry contained on the card to the host device. Host devices, such as laptop computers, contain expansion slots which receive the expansion cards and provide electrical connections thereto. Modems and network adapters are often constructed in PC Card standard form factor.

As a consequence of hardware miniaturization in the face of a nearly worldwide RJ connector standard, hardware manufacturers have developed myriad proprietary hardware connection standards and an assortment of connectors and adapters that allow the RJ plugs to be connected to thin profile hardware.

One elegant and convenient connector which allows connection of the standard RJ type plug with thin profile hardware is the XJACK® produced by 3Com Corporation, Salt Lake City, Utah. The XJACK®, shown generally in FIG. 3, is a thin profile connector designed to be contained within hardware such as PC Card standard compliant devices. The XJACK® comprises a thin body 60 with an aperture 62 therein for receiving a standard RJ connector plug 64 or some other connector. Jack conductors 66 contact plug conductors 68 just as a conventional RJjack connects. The XJACK® may be retractable within the device or be detachable therefrom. Commonly used XJACK® connectors retract in and out of a device by sliding along a track. A spring is often used to bias the XJACK® connector such that it pops out of its retracted state and remains extended during use.

Wireless communication devices are now becoming commonplace in the electronics industry. Wireless networking of portable computers and associated devices is now replacing a large segment of the networking market. Wireless communication devices including wireless networking adapters, hubs and other equipment utilize radio transmitters and receivers to transmit data signals from one device or node to another. These radio transmitters and receivers must utilize a specific frequency band and protocol to accomplish this task. Since these wireless networks and communications areas may often overlap, standards, protocols and privacy protection are necessary. One current standard in the industry has been established by the Institute of Electrical and Electronics Engineers, Inc. (IEEE) and is known as IEEE 802.11. This standard comprises communications standards, protocol and equipment specifications for wireless communication equipment including privacy and encryption provisions.

Another emerging standard in wireless communications and networking, known as Bluetooth®, is being established by a collaborative group of communications and computing companies. Devices incorporating Bluetooth® technology will utilize a micro-chip transceiver for communications between devices. Bluetooth® devices will transmit in the previously unused 2.4 GHz range. Bluetooth® technology promises to be a viable and economical networking solution for interconnection of cell phones, computers, printers, modems, computer peripherals, fax machines and other communications and computing devices. The size of the Bluetooth® transceiver will make it usable in devices as small as palm computers and cell phones.

Antennas are well known for enabling and improving transmission to radio receivers and from radio transmitters. Antennas can dramatically increase the range of radio transceivers, however most antenna designs function best when protruding from their host device. In small electronic devices protruding antennas are often vulnerable to breakage as the devices are often stowed in purses, pockets, backpacks and other areas where neglect can occur. Often a retractable antenna is more convenient and durable. Further convenience is afforded through an antenna which can be easily replaced through a removable attachment.

When antennas are incorporated into thin-profile devices such as PC Card standard expansion cards, very little space is left above and below the antenna. This lack of space makes electrical connection difficult to achieve at the top or bottom of the antenna. The metal case on many PC Card standard cards makes top and bottom connections even more problematic as electrical shorting to the case must be precluded. Consequently, edge connections are desirable in these applications.

Small electronic devices often have plastic cases or housings which are injection molded around a PCB or other circuitry. These plastic materials in which circuitry may be encased are often molded at high temperatures. When the molding temperature of a plastic material approaches the melting temperature of solder used for the circuitry to be encased, 5the solder connections can be compromised during the injection molding process. In effect, the flow of molten plastic can melt and disconnect soldered connections on the PCB or other circuitry. This possibility makes injection molding of thermoplastics undesirable around soldered connections.

While wireless technology is fast replacing a large segment of the communications and networking industry, wired equipment is still prevalent. A communications or computing device, such as a portable computer, which can connect to both wireless and conventionally wired networks will be more adaptable and convenient at the present time.

SUMMARY AND OBJECTS OF THE INVENTION

The present invention relates to movable electronic components in electronic devices which have little space above and below the PCB for connections thereto. When clearance above and below the PCB is limited, these components can be edge connected using edge plating techniques thereby allowing connections which do not increase the height profile of the component. Preferred embodiments of the present invention comprise retractable and removable components such as antennas, physical/electrical media connectors such as plugs and jacks and other devices. The edge connection methods of the present invention are especially useful in PC Card standard devices with extremely limited clearances. They are also useful in devices with other thin profile formats and form factors.

In a first embodiment of the present invention, a movable electronic component comprising a PCB and other circuitry has a PCB with at least one edge that has been prepared with a smooth flat surface. This edge preparation can be achieved by various known techniques using cutting, grinding, routing, and polishing apparatus. Once the edge surface has been prepared, the surface is etched, plated or otherwise prepared for application of conductive surfaces using practices known in the industry for PCB top and bottom surfaces, however, this process is extended to the prepared edge surface to apply conductive surfaces thereto. These conductive edge surfaces typically continue onto a PCB top or bottom surface and electrically connect to circuitry thereon. Once conductive surfaces have been applied to the edge they may be framed in, partially covered or otherwise protected or insulated to help define the shape or configuration of the surface. This can be achieved by overmolding with plastic materials preferably in conjunction with encasement of the component.

A second embodiment of the present invention produces an edge plated PCB by a different method. Apertures which pass through a PCB between layers or completely through the PCB to the opposite side are often referred to as "vias." Vias can be used to connect circuitry on one PCB layer to another layer of the PCB. These vias can also be used as a method of edge plating a PCB. This is achieved by drilling, milling or otherwise forming vias in a PCB along a line or path which can later be bisected with a cutting apparatus. Once the vias are formed, the apertures are filled with copper or other conductive material during the plating process. The filled vias are subsequently cut in half leaving their cross-sectional surface exposed along the new edge of the cut PCB. The cut surface may then be polished or otherwise prepared for connection to electrical contacts.

The methods of the present invention are particularly suited for thin profile devices and especially movable, retractable and removable extensions within thin profile devices. Preferred embodiments include antennas and physical/electrical media connectors which retract within thin profile devices with limited space above and below the PCB.

Accordingly, it is an object of some embodiments of the present invention to provide a retractable extension comprising electronic components with edge plating on an internal PCB.

It is also an object of some embodiments of the present invention to provide a connection to a thin profile electronic component which does not increase the height of the component.

It is also an object of some embodiments of the present invention to provide a thin profile electrical contact on an electronic, retractable extension.

It is another object of some embodiments of the present invention to provide a thin profile electrical connection for a retractable physical/electrical media connector.

It is another object of some embodiments of the present invention to provide a thin profile electrical connection for a retractable antenna.

It is yet another object of some embodiments of the present invention to provide electrical conductors on the edge of PCB's in electronic components. These and other objects and features of the present invention will become more fully apparent from the following, description and appended claims, or may be learned by the practice of the invention as set forth hereinafter.

BRIEF DESCRIPTION OF THE DRAWINGS

In order that the manner in which the above-recited and other advantages and objects of the invention are obtained, a more particular description of the invention briefly described above will be rendered by reference to specific embodiments thereof which are illustrated in the appended drawings. Understanding that these drawings depict only typical embodiments of the invention and are not therefore to be considered to be limiting of its scope, the invention will be described and explained with additional specificity and detail through the use of the accompanying drawings in which:

FIG. 6A is a perspective view of a PCB of an electrical component showing vias filled with conductive material and a cutting plane there through.

DETAILED DESCRIPTION OF THE PREFERRED EMBODIMENTS

The figures listed above are expressly incorporated as part of this detailed description.

It will be readily understood that the components of the present invention, as generally described and illustrated in the Figures herein, could be arranged and designed in a wide variety of different configurations. Thus, the following more detailed description of the embodiments of the system and apparatus of the present invention, as represented in FIGS. 1 through 6B, is not intended to limit the scope of the invention, as claimed, but it is merely representative of the presently preferred embodiments of the invention.

The currently preferred embodiments of the present invention will be best understood by reference to the drawings, wherein like parts are designated by like numerals throughout.

The Personal Computer Memory Card International Association (PCMCIA) promulgates the PC Card Standard for thin profile or thin architecture expansion cards for electronic devices. The PC Card standard designates the physical dimensions of the cards as well as the electrical configuration of the cards including the 68-pin interface between the card and the host device. The physical dimensions of cards conforming to this standard are 85.6 mm in length by 54.0 mm in width. Several thickness variations fall within the standard and are designated by type designation. Type I, II, and III PC Cards have thicknesses of 3.3 mm, 5.0 mm and 10.5 mm respectively. Any references to the PC Card Standard or PCMCIA card standard refer to electronic cards substantially conforming to this standard as described herein.

The term miniature modular jack, physical/electrical media connector, fixed jack, XJACK, alligator jack, and the like, connotes a media connector that may have qualities such as those connectors having physical attributes described in F.C.C. Part 68, Subpart F. Specific terms such as RJ-type, RJ-11, RJ-45, 6-pin miniature modular plug, 8-pin miniature modular plug, and similar terminology are all references to specific exemplary physical/electrical media connectors falling within the broader parameters of the term physical/electrical media connectors and are cited by way of example and should not be used to limit the scope of the present invention to specific connectors.

Figure 1:
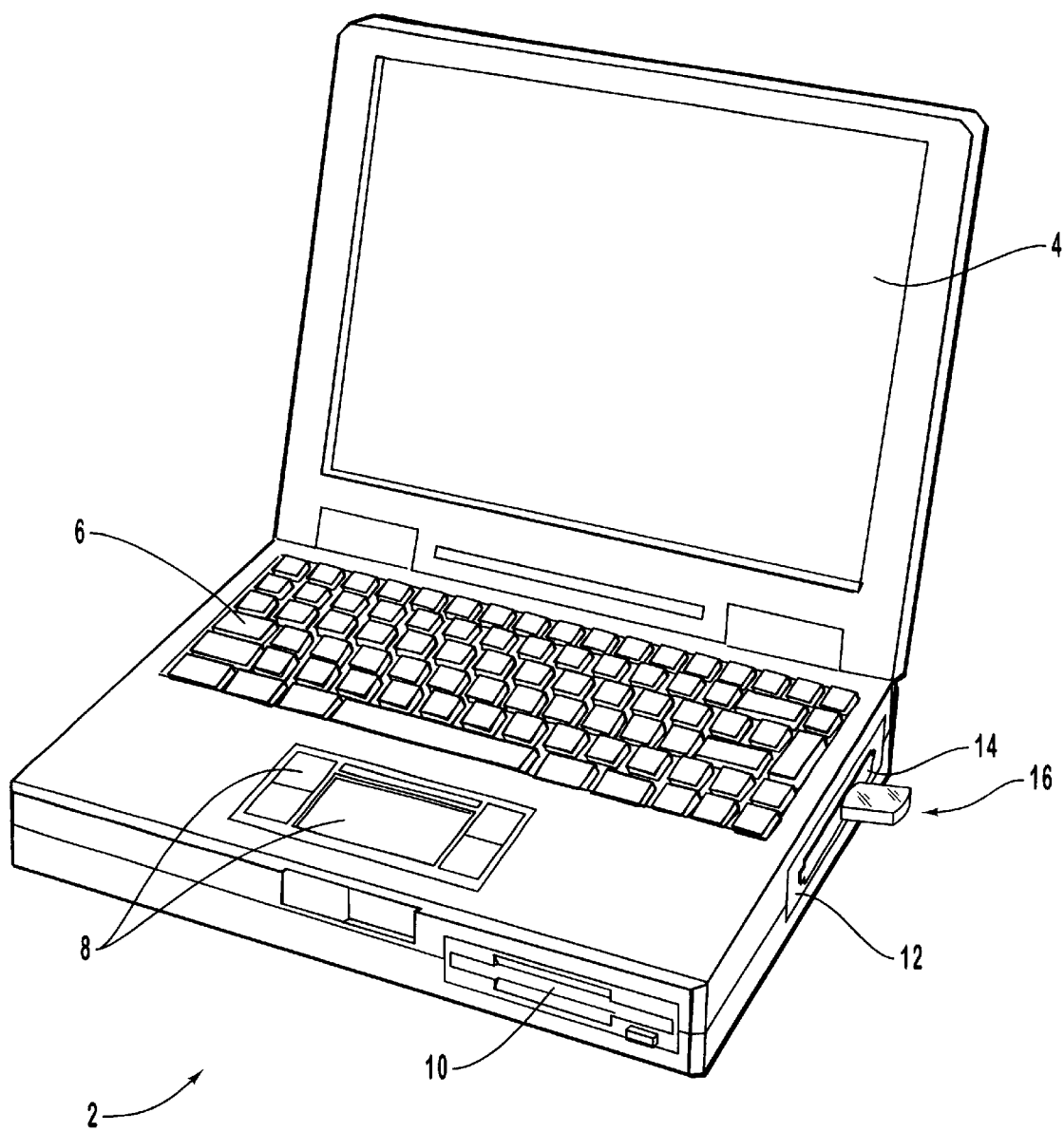
FIG. 1 is a perspective view of a portable electronic device with expansion card slots containing an expansion card with a retractable extension therein.

In reference to FIG. 1, a portable computer 2 is shown with a display 4, keyboard 6, pointing device 8, floppy disk drive 10, and expansion card slots 12. An expansion card slot 12 is filled with an expansion card 14 which comprises a retractable extension 16 which can be selectively extended (as shown) and retracted into expansion card 14. Expansion cards of various formats may also be fitted to other electronic devices for example, and not by way of limitation, palm computing devices, cell phones, cameras, pagers and other devices.

Figure 2A:
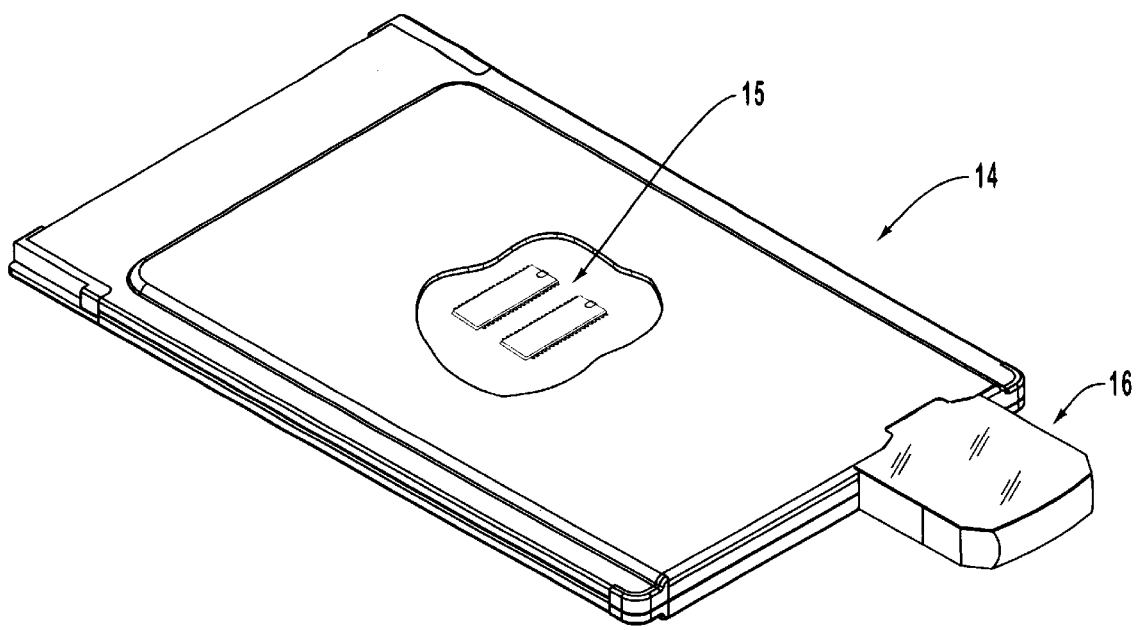
FIG. 2A is a perspective view of an expansion card with a retractable extension in an extended position.
Figure 2B:
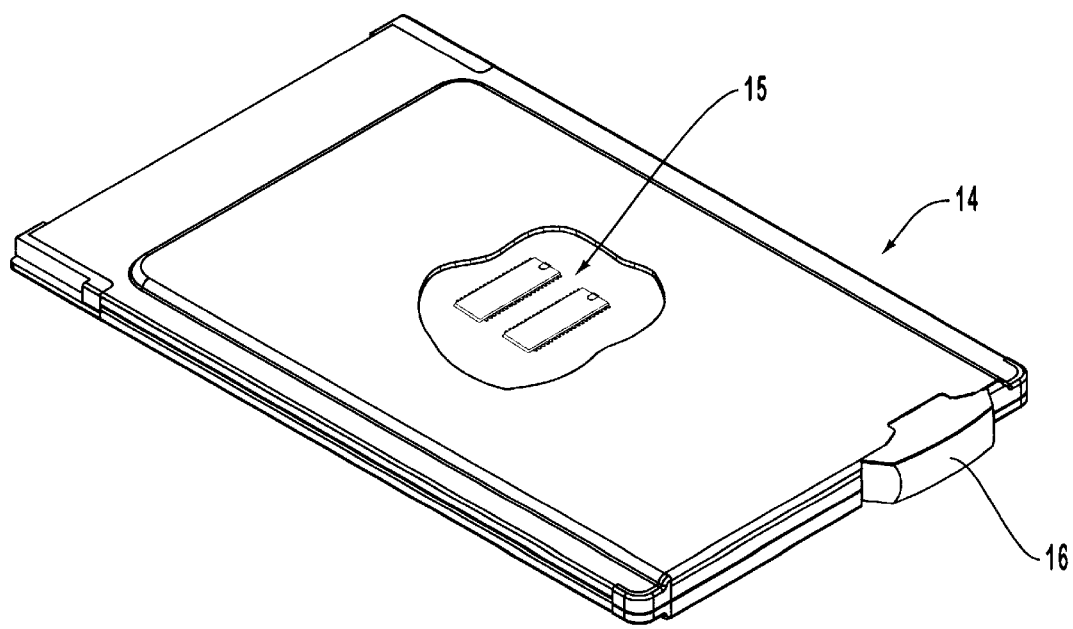
FIG. 2B is a perspective view of an expansion card with a retractable extension in a retracted position.

An expansion card conforming to the PC Card standard is shown in FIG. 2A with retractable extension 16 in an extended position. Circuitry 15 within expansion card 14 may comprise a wireless transceiver, wireless network adapter, modem, network adapter or other electronic device. When circuitry contained within extension 16 is not in use, extension 16 may be retracted, as shown in FIG. 2B, to save space for storage or to protect the circuitry within extension 16. The circuitry within extension 16 may comprise a physical/electrical media connector such as a thin profile jack or plug which provides connectivity to communications cables and networks. When not in use it can be conveniently retracted into a protected position.

Figure 3:
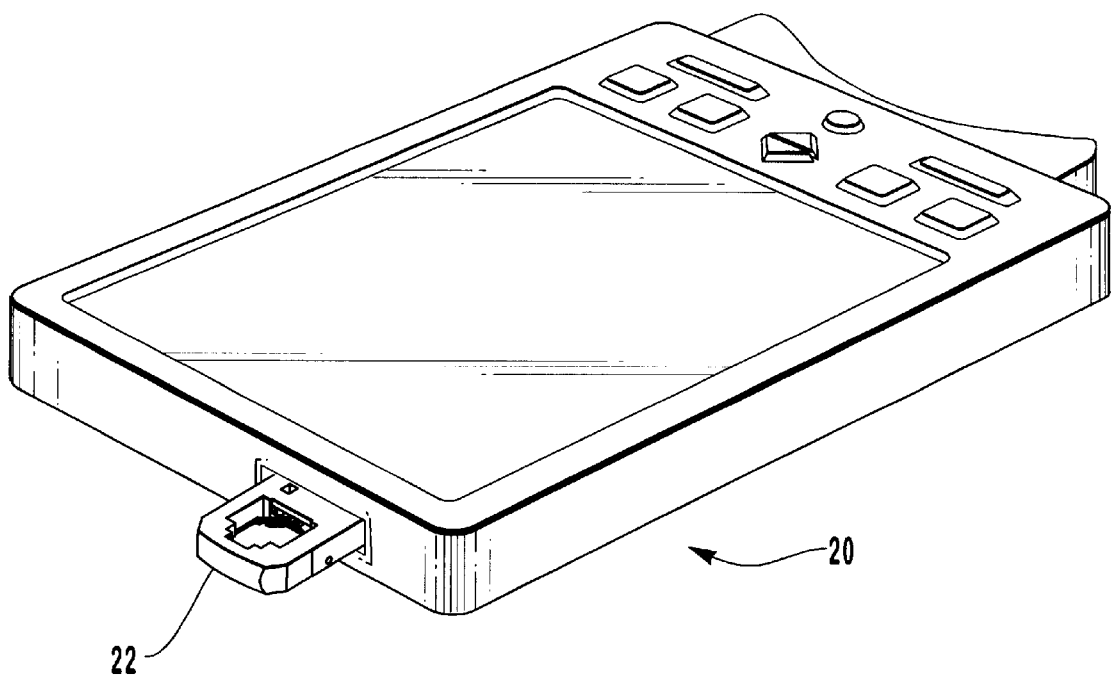
FIG. 3 is a perspective view of an electronic device with an integral retractable extension

The movable and/or retractable electrical extensions of preferred embodiments of the present invention may also be built directly into an electronic device as shown in FIG. 3. The electronic device may be a palm computing device 20 or some other device. Retractable or removable extension 22 is an integral part of device 20 and connects directly thereto without the use of expansion cards or their slots.

Figure 4:
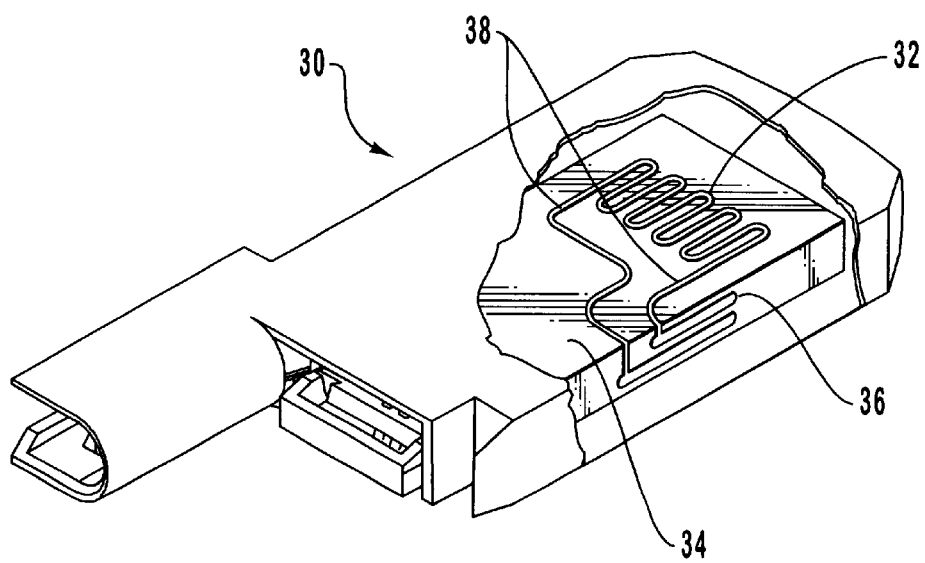
FIG. 4 is a perspective view of a movable, retractable extension with electronic components and circuitry showing an internal PCB with edge plated conductors.

The extensions of preferred embodiments of the present invention, of which an example is shown in FIG. 4, contain electrical or electronic circuitry 32. Circuitry 32 may comprise, for example and not by way of limitation, a patch antenna, an inverted F antenna, a monopole antenna, a dipole antenna, a transmitter, a transceiver or a physical/electrical media connector such as a plug or a jack.

Circuitry 32 often comprises a PCB 34 on which conductors and components are located. Due to the narrow characteristics of extensions of the present invention, very little space is available above and below the PCB 34. PCB's used in currently preferred embodiments of the present invention have a thickness of about 0.1". Height restrictions above and below the PCB 34 make electrical connections on the top or bottom face of the PCB difficult. Furthermore, solder connections are problematic because thermoplastic materials are molded around the circuit and PCB to encase extension 30. These thermoplastic materials have a molding temperature close to the melting temperature of solder creating a risk of melting the solder connection during plastic molding. The actual flow of plastic during the molding process can melt and detach a soldered connection rendering the extension useless.

Despite these restrictions and limitations, circuitry 32 must make an electrical connection with a host device 20 or host card 14. This can be achieved through the use of an edge electrical connection 36 along the edge of the PCB 34. Conductive layers 38 on the top or bottom faces of PCB 34 may be extended to the edges of PCB 34 forming edge connections 36. This cannot be achieved with atypical PCB due to the rough edges left after production of the boards. However, these edges can be specially prepared to receive conductive plating.

Figure 5A:
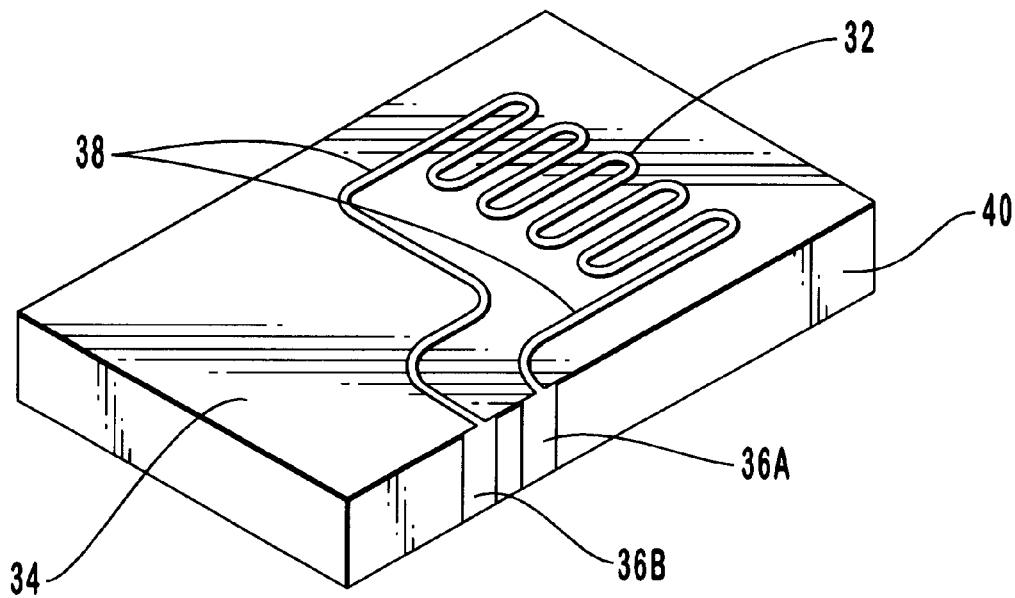
FIG. 5A is a perspective view of a PCB of an electrical component showing direct edge plating on a prepared edge surface.
Figure 5B:
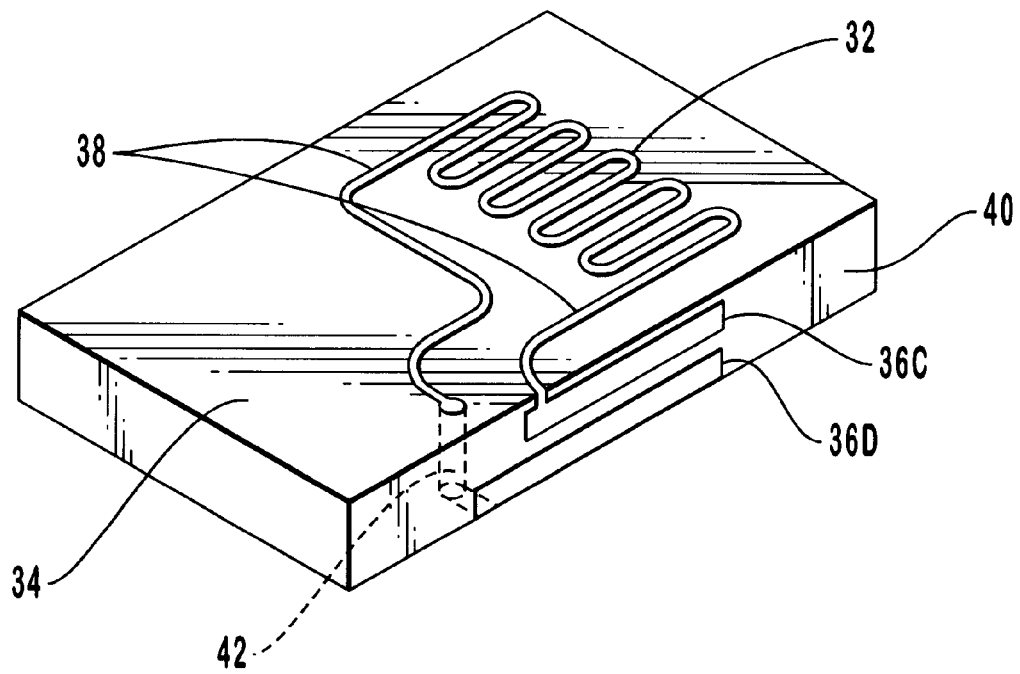
FIG. 5B is a perspective view of a PCB of an electrical component showing direct edge plating on a prepared edge surface along with a via for connection to the edge plating.

In a first embodiment of the present invention, shown in FIGS. 5A–5B, edge 40 has been specially prepared to receive conductive plating material. Edge 40 has been cut, ground, routed, and/or polished in such a way to obtain a surface smoothness similar to that of the PCB face. Edge 40 is then etched or otherwise marked to designate select plating areas using known PCB face plating techniques or it may be plated over its entire surface with conductive material and subsequently routed or milled to remove plating from select areas. The result is a PCB edge 40 with select conductive surfaces 36A and 36B to which electrical connections can be made.

In FIG. 5A, multiple conductive surfaces 36A and 36B are created by extending conductive plating from face 34 of the PCB to edge 40. Multiple conductive surfaces 36A and 36B may also be connected to both sides of PCB 34 as shown in FIG. 5B. This can be achieved by running a via 42 through PCB 34 and extending conductive plating from via 42 to edge conductive surface 36D.

Figure 6A:
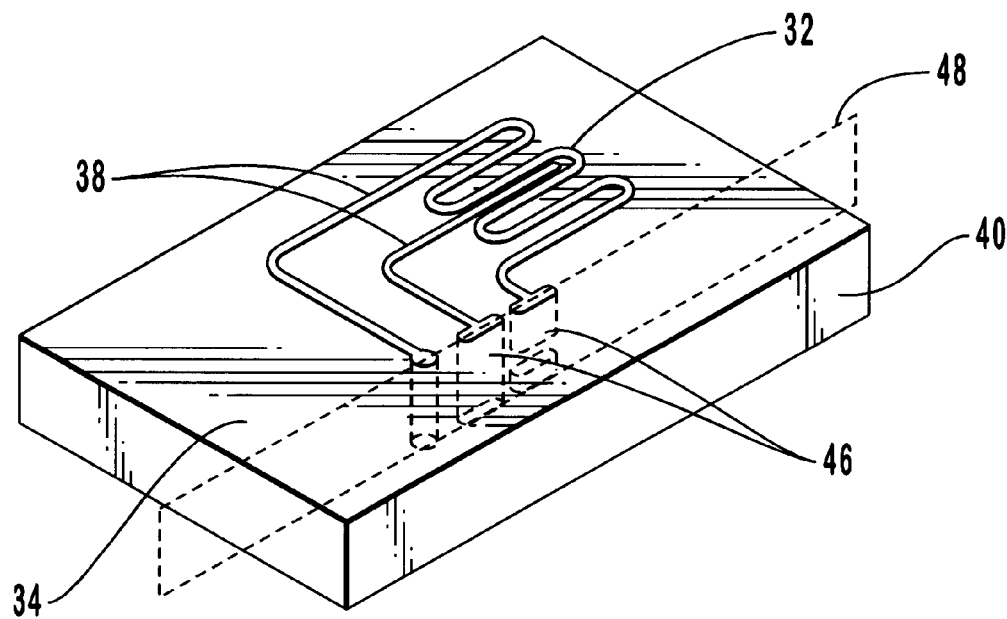
Figure 6B:
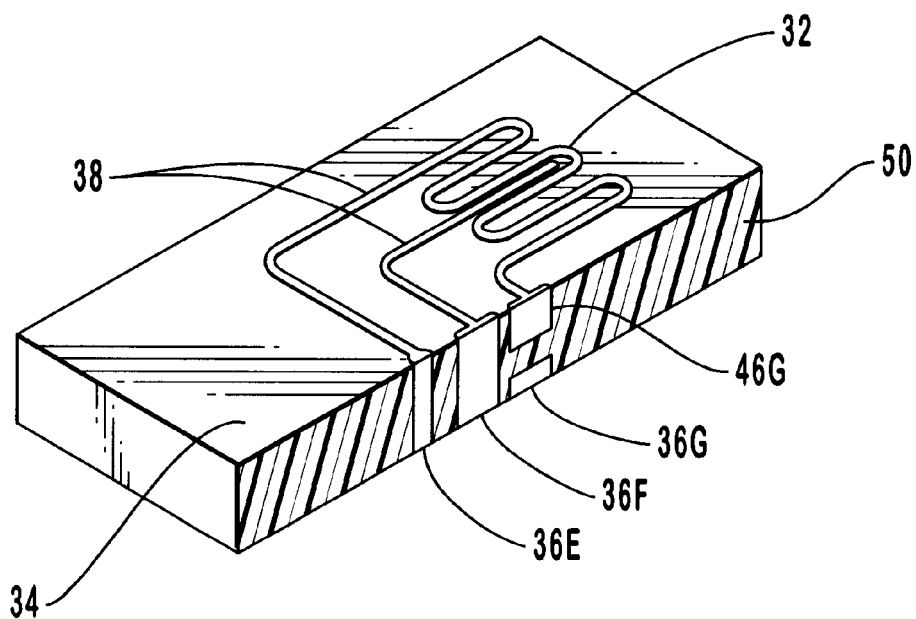
FIG. 6B is a perspective view of the PCB shown in FIG. 5A after cutting and surface finish operations.

In a second embodiment of the present invention, as shown in FIGS. 6A–6B, edge conductive surfaces 36E–36G and 46G are created using alternative methods. These methods comprise drilling, boring or otherwise forming apertures or vias 46 in PCB 34 along a line or curve 48 designating a surface to be exposed. Vias 46 may extend completely through PCB 34 or may terminate part way through PCB 34 as at 46G. Once vias 46 have been formed they are filled with conductive material such as copper or other material. This filling may be performed in conjunction with the PCB face plating process such that the vias are filled with face plating material as the face plating is achieved. Once vias 46 have been filled, PCB 34 is cut along line or curve 48 such that the cut intersects vias 46 and exposes surface 50 of the PCB and conductive surfaces 36E–36G and 46G. Surface 50 and surfaces 36E–36G and 46G may then be further prepared to receive electrical connections as needed.

Once edge conductive surfaces 36–36G and 46G have been prepared, connections may be made thereto without increasing the height of PCB 34 or incurring the risks of soldered connections to the board. The extension containing PCB 34 may subsequently be encased in plastic or another material leaving portions of conductive surfaces 36–36G and 46G exposed for electrical contact. Edge 50 may be partially framed or partially covered with plastic to retain and protect conductive surfaces 36–36G and 46G.

The present invention may be embodied in other specific forms without departing from its spirit or essential characteristics. The described embodiments are to be considered in all respects only as illustrated and not restrictive. The scope of the invention is, therefore, indicated by the appended claims rather than by the foregoing description. All changes which come within the meaning and range of equivalency of the claims are to be embraced within their scope.

I claim:

1. An electronic device comprising:
   a movable extension extendable from said device;
   electrical circuitry on said extension, said circuitry being in electrical communication with said device;
   a PCB having an edge; and
   an electrically conductive surface bonded to said edge and coupled to the electrical circuitry wherein a component may be electrically edge connected to said device.

2. The device of claim 1 wherein said electrical circuitry is an antenna.

3. The device of claim 1 wherein said electrical circuitry is a physical/electrical media connector.

4. The device of claim 1 wherein said electrically conductive surface is formed by plating a prepared surface on said edge.

5. The device of claim 1 wherein said electrically conductive surface is formed by filling vias with conductive material and subsequently exposing portions of said vias.

6. A computer expansion card comprising:
   a movable extension extendable from said card, said extension comprising;
   electrical circuitry;
   a PCB having an edge; and
   an electrically conductive surface bonded to said edge and coupled to the electrical circuitry wherein a component may be electrically edge connected to said device.

7. The expansion card of claim 6 wherein said expansion card is a small form factor card.

8. The expansion card of claim 6 wherein said extension is a thin profile retractable jack.

9. The expansion card of claim 6 wherein said extension comprises a removable antenna.

10. The expansion card of claim 6 wherein said extension comprises a removable, thin profile physical/electrical media connector.

11. The expansion card of claim 6 wherein said expansion card comprises a wireless transceiver.

12. The expansion card of claim 6 wherein said expansion card comprises a wireless network adapter.

13. The expansion card of claim 6 wherein said expansion card comprises a combination network adapter and modem.

14. An electronic device comprising:
   a retractable and removable electrical extension;
   an aperture through which said extension may project;
   a track on which said extension may move from a retracted position interior to said electronic device to an extended position exterior to said electronic device;
   said extension comprising
      a PCB having electrical circuitry and at least one edge, at least one electrically conductive surface on said edge, said conductor being connected to said electrical circuitry.

15. The electronic device of claim 14 wherein said extension comprises an antenna.

16. The electronic device of claim 14 wherein said extension comprises a physical/electrical media connector.

17. A system for affording electrical contact between an extensible printed circuit board and a host device, said system comprising:
   an extensible printed circuit board having an upper surface, a lower surface and at least one edge;
   an electrically conductive surface formed on said at least one edge of the extensible printed circuit board; and
   a conductor formed in the host device to enable selective electrical contact with said conductive surface as the printed circuit board is extended and retracted from the host device.

18. A system as recited in claim 17, wherein the electrical contact between the conductor of the host device and the conductive surface of the extensible printed circuit board is maintained continuously as the printed circuit board is extended and retracted.

19. A system as recited in claim 17, wherein the printed circuit board may be completely removed from the host device and wherein electrical contact will be reestablished upon reinsertion of the printed circuit board into the host device.

20. A system as recited in claim 17, wherein the printed extensible circuit board comprises an antenna.

21. A system as recited in claim 17, wherein the printed extensible circuit board comprises a physical/electrical media connector RJ-type socket formed within is upper surface.

22. A computer expansion card comprising:
a moveable extension extendable from said card, said extension comprising;
   electrical circuitry, and
   a PCB having an edge, said edge defining at least one via, divided substantially lengthwise, said at least one VIA being filled with electrically conductive material coupled to the electrical circuitry, said electrically conductive material in said VIA being exposed along said edge of said PCB thereby providing an electrically conductive surface along said edge.

* * * * *